United States Patent
Goller et al.

(10) Patent No.: US 10,377,626 B2
(45) Date of Patent: Aug. 13, 2019

(54) APPARATUS WITH A HIGH HEAT CAPACITY AND METHOD FOR PRODUCING THE SAME

(71) Applicant: Infineon Technologies AG, Neubiberg (DE)

(72) Inventors: Bernd Goller, Otterfing (DE); Matthias Steiert, Rosenheim (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/957,349

(22) Filed: Apr. 19, 2018

(65) Prior Publication Data
US 2018/0305200 A1 Oct. 25, 2018

(30) Foreign Application Priority Data
Apr. 21, 2017 (DE) .................. 10 2017 206 744

(51) Int. Cl.
| | | |
|---|---|---|
| *H01L 23/02* | (2006.01) | |
| *B81B 7/00* | (2006.01) | |
| *B81C 1/00* | (2006.01) | |
| *H04R 19/04* | (2006.01) | |
| *H04R 1/08* | (2006.01) | |
| *H04R 19/00* | (2006.01) | |

(52) U.S. Cl.
CPC .......... *B81B 7/0064* (2013.01); *B81B 7/0058* (2013.01); *B81C 1/00261* (2013.01); *H04R 1/086* (2013.01); *H04R 19/005* (2013.01); *H04R 19/04* (2013.01)

(58) Field of Classification Search
None
See application file for complete search history.

(56) References Cited

U.S. PATENT DOCUMENTS

| | | | | |
|---|---|---|---|---|
| 2004/0061207 A1* | 4/2004 | Ding | ................... | B81B 7/0038 257/678 |
| 2007/0265379 A1* | 11/2007 | Chen | ................... | B82Y 30/00 524/404 |
| 2009/0085191 A1* | 4/2009 | Najafi | .................. | B81B 7/0058 257/698 |
| 2016/0011020 A1* | 1/2016 | Ehrenpfordt | ......... | G01D 11/245 73/431 |

FOREIGN PATENT DOCUMENTS

| | | |
|---|---|---|
| DE | 102010026519 A1 | 1/2012 |
| DE | 102013102213 A1 | 9/2014 |
| DE | 102017109821 A1 | 11/2017 |

* cited by examiner

*Primary Examiner* — Calvin Y Choi
(74) *Attorney, Agent, or Firm* — Slater Matsil, LLP (57) ABSTRACT

The present disclosure relates to an apparatus comprising a substrate, wherein a MEMS module is arranged on a first side of the substrate, the output signal from said MEMS module changing in the event of a change in temperature. Furthermore, the apparatus has a housing structure which is arranged on a first side of the substrate and has a recess in which the MEMS module is arranged. The apparatus also has a layer which is applied to the housing structure and increases the heat capacity of the apparatus. The present disclosure also relates to a method for producing an apparatus of this kind.

21 Claims, 6 Drawing Sheets

```
Providing a wafer substrate comprising a large number of MEMS modules which are
arranged on a first side of the wafer substrate, wherein an output signal from each
MEMS module changes in the event of a change in temperature, and comprising
a large number of housing structures which are arrange on the first side of the wafer
substrate, wherein each housing structure has a respective recess in which in each
one of the MEMS modules in arranged, wherein in each case one housing
structure, together with the respective MEMS module, form a respective package
```
— 601

```
Applying a layer to at least one side of the housing structure of a package, wherein
the layer increases the heat capacity of the respective package
```
— 602

```
Separating the packages
```
— 603

APPARATUS WITH A HIGH HEAT CAPACITY AND METHOD FOR PRODUCING THE SAME

This application claims the benefit of German Application No. 102017206744.6, filed on Apr. 21, 2017, which application is hereby incorporated herein by reference in its entirety.

TECHNICAL FIELD

The present disclosure relates to an apparatus with a high heat capacity and method for producing the same.

BACKGROUND

Various types of MEMS (Micro-Electro-Mechanical-System) packages may include an electronic component which is arranged on a substrate, for example a MEMS module and a housing that surrounds and protects the MEMS module against external influences, such as dust and dirt for example. Some housings also shield the MEMS module from external electromagnetic radiation. Housings which are composed of metal are often used for this purpose.

Known high-frequency shields use, for example, an absorption principle in the case of which the housing and the substrate are electrically grounded. Therefore, direct irradiation of the electronic component with an external high-frequency radiation can be considerably damped or avoided.

SUMMARY

The apparatus disclosed in this document has, amongst other things, a substrate, wherein a MEMS module is arranged on a first side of the substrate, the output signal from said MEMS module changing in the event of a change in temperature. The apparatus also has a housing structure which is arranged on the first side of the substrate and has a recess in which the MEMS module is arranged. A layer is applied to the housing structure and increases the heat capacity of the entire apparatus, or at least the heat capacity of the housing structure.

These apparatuses can be produced, for example, as individual chips. However, a plurality of apparatuses of this kind can also be produced together, for example at the wafer level. To this end, the present disclosure proposes providing a wafer substrate comprising a large number of MEMS modules which are arranged on a first side of the substrate, wherein an output signal from each MEMS module changes in the event of a change in temperature. Furthermore, the provided wafer substrate may have a large number of housing structures which are arranged on the first side of the wafer substrate, wherein each housing structure has a recess in each of which one of the MEMS modules is arranged, so that a package is formed. In the method, a layer is also applied to at least one side of the housing structure of a package, wherein the layer increases the heat capacity of the entire package. The packages, that is to say the housing structures together with the MEMS module which is arranged therein and also the substrate, can then be separated.

BRIEF DESCRIPTION OF THE DRAWINGS

Exemplary embodiments of the present disclosure are illustrated in the drawing and will be explained below. In the drawing.

DETAILED DESCRIPTION OF ILLUSTRATIVE EMBODIMENTS

In the text which follows, a few exemplary embodiments will be described in more detail with reference to the figures, wherein elements with the same or a similar function are provided with the same reference symbols.

Metal housings used in the packaging of MEMS components may provide very good shielding against external electromagnetic radiation. However, a previously unknown effect, which will be called high-frequency thermal coupling in the text which follows, has been observed. This effect causes heating of the shielding of the housing of the MEMS package.

In the case of this high-frequency thermal coupling, the high-frequency energy which is absorbed by the housing is converted into thermal energy. Consequently, the temperature within the housing may suddenly increases by a few microkelvins. This leads to undesired effects in electronic components which react to changes in temperature by changing their system response. Therefore, for example in the case of MEMS microphones, the signal-to-noise ratio (SNR) can be adversely affected as a result.

Accordingly, it is desirable to provide packages and also methods for producing packages of this kind which provide protection against high-frequency thermal coupling of this kind.

Figure 7:
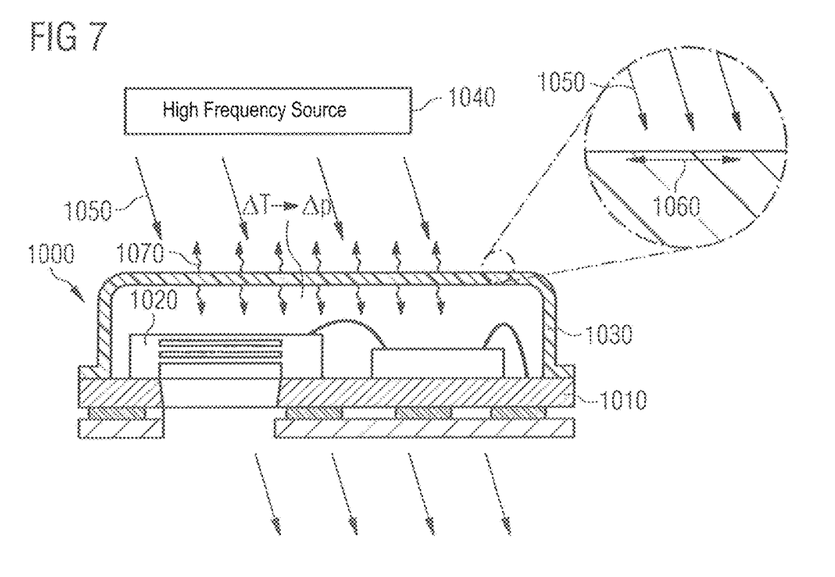
FIG. 7 shows a basic sketch for illustrating the effect of the high-frequency thermal coupling.

To begin with, said high-frequency thermal coupling should be explained in more detail for better understanding of the following description. FIG. 7 shows, by way of example, an apparatus 1000 which does not have a layer according to the present disclosure.

The apparatus 1000 has a substrate 1010, a MEMS module 1020 which is arranged on said substrate, and also a housing 1030. An external high-frequency source 1040 emits electromagnetic radiation 1050 which is absorbed by the housing 1030. This produces eddy currents 1060 which propagate in the housing 1030 and lead to heating of the housing 1030. This heating or the thermal energy produced in the process is schematically illustrated by the arrows 1070.

The thermal radiation 1070 is given off both to the outside and to the inside. The thermal radiation 1070 which is given off into the interior of the housing 1030 accordingly heats the interior of the housing 1030. If the MEMS module 1020 has a temperature-sensitive response, the output signal from said MEMS module will change in accordance with the magnitude of the change in temperature. In the case of some MEMS modules 1020, such as in the case of MEMS microphones of the current type for example, even a fluctuation of a few microkelvins is enough to have this effect.

Figure 8:
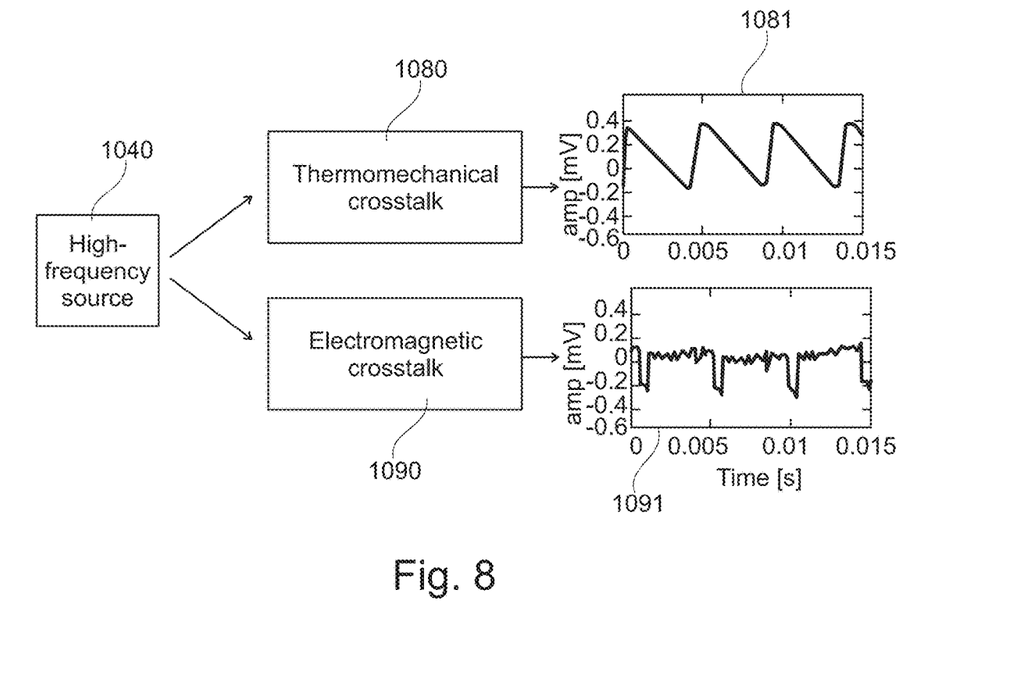
FIG. 8 shows measurement results for demonstrating the effect of the high-frequency thermal coupling.

FIG. 8 shows measurement results of a heat-sensitive MEMS module of this kind. The schematically illustrated high-frequency source 1040 causes both thermomechanical crosstalk 1080 and also electromagnetic crosstalk 1090 on the output signal from the MEMS module. However, it can be seen in graphs 1081, 1091 that the share of thermomechanical crosstalk is predominant.

With this background knowledge, the apparatus and the method according to the present disclosure will now be described in more detail with reference to the figures.

Figure 1:
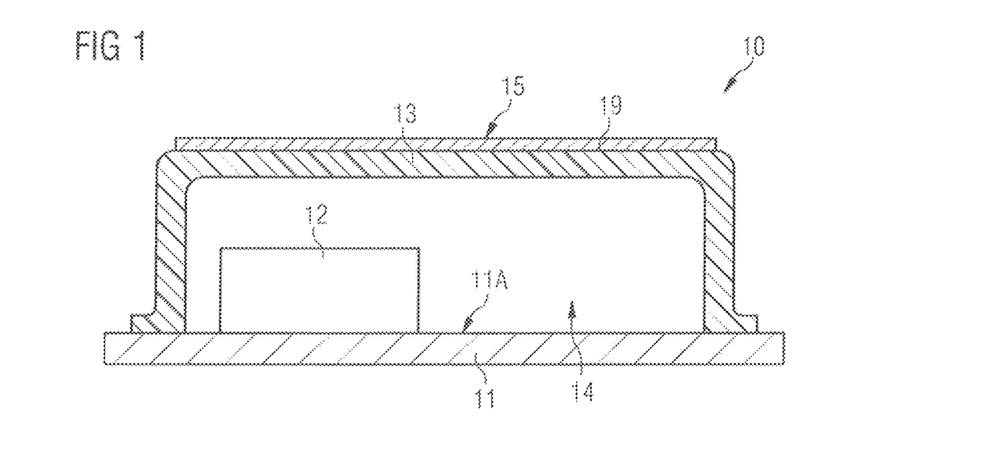
FIG. 1 shows a side view of an exemplary embodiment of an apparatus according to the present disclosure.

FIG. 1 shows an exemplary embodiment of an apparatus 10 according to the present disclosure. The apparatus 10 has a substrate 11. A MEMS module 12 is arranged on a first side 11A of the substrate 11. The MEMS module 12 has a heat-sensitive response, that is to say the output signal from the MEMS module 12 changes in response to a change in temperature of the medium surrounding the MEMS module 12.

Furthermore, a housing structure 13 is arranged on the first side 11A of the substrate 11. The housing structure 13 has a recess 14. The MEMS module 12 is arranged in the interior of the housing structure 13, or in the recess 14. The housing structure 13 therefore surrounds the MEMS module 12 and forms a housing for the MEMS module 12 which is arranged on the substrate 11.

This arrangement of the apparatus 10 forms a so-called package and will also be called an OCP (Open Cavity Package) in the text which follows.

The apparatus 10 according to the present disclosure also has a layer 15 which is applied to the housing structure 13. The layer 15 is provided in order to increase the heat capacity of the entire apparatus 10, or of the package 10, specifically in comparison to an apparatus 10 without this layer 15.

The layer 15 can be arranged directly on the housing structure 13. Accordingly, as depicted, no further parts can be located between the housing structure 13 and the layer 15. Therefore, the layer 15 for the most part increases the heat capacity of the housing structure 13. Since the housing structure 13 can be arranged directly on the substrate 11, the heat capacity of the substrate 11 and therefore the heat capacity of the entire package 10 can therefore be increased at the same time.

The heat capacity is also called the thermal mass. It represents the quantity of heat which a component can absorb in the event of a specific change in temperature. The greater the heat capacity, the more energy is required in order to heat the component.

Therefore, owing to the increase in the heat capacity of the apparatus 10 by means of the layer 15, more energy is required in order to heat the apparatus 10. Or, in other words, in the event of an increase in the thermal capacity of the apparatus 10, more time is required in order to heat the apparatus 10 given the same amount of energy.

The advantage of the apparatus 10 is therefore that, given the same level of intensity of the radiation of a high-frequency source, the apparatus 10 requires considerably longer to heat up in the event of the absorption of the radiation. As a result, it is also considerably longer until the interior 14 of the housing structure 13 heats up. The temperature in the interior 14 of the housing structure 13 can therefore be kept constant over a longer period of time. In the case of time-critical measurements, for example in the range of milliseconds, the output signal from the heat-sensitive MEMS module 12 is adversely affected to a significantly lesser extent by this than in the case of packages without a layer 15 of this kind or with a lower heat capacity.

In general, the heat capacity C of a body is defined as the ratio of the heat $\Delta Q$ which is supplied to the body to the change in temperature $\Delta T$ which is caused as a result, in accordance with the formula:

$$C = \frac{dQ}{dT}$$

According to one example of the present disclosure, the layer 15 can have a heat capacity which is greater than the heat capacity of the housing structure 13.

By way of example, the heat capacity of the layer 15 is greater than the heat capacity of the housing structure 13 by at least a factor of one and a half, or by at least a factor of two.

It is also feasible that the layer 15 has a thermal conductivity of less than $$1.0 \cdot 10^{-6} \frac{m^2}{s},$$

or of less than $$0.5 \cdot 10^{-6} \frac{m^2}{s},$$

or of less than $$0.2 \cdot 10^{-6} \frac{m^2}{s}.$$

The layer 15 can, as depicted, be arranged, for example, on at least one outer side 19 of the housing structure 13. The outer sides of the housing structure 13 are the outer sides or surfaces of the housing structure 13 which are arranged opposite the interior 14. In the example depicted in FIG. 1, the layer 15 is arranged on a top side 19 of the housing structure 13. The top side 19 of the housing structure 13 is that side of the housing structure 13 which is furthest away and can run, for example, parallel to the first substrate side 11A.

Figure 2:
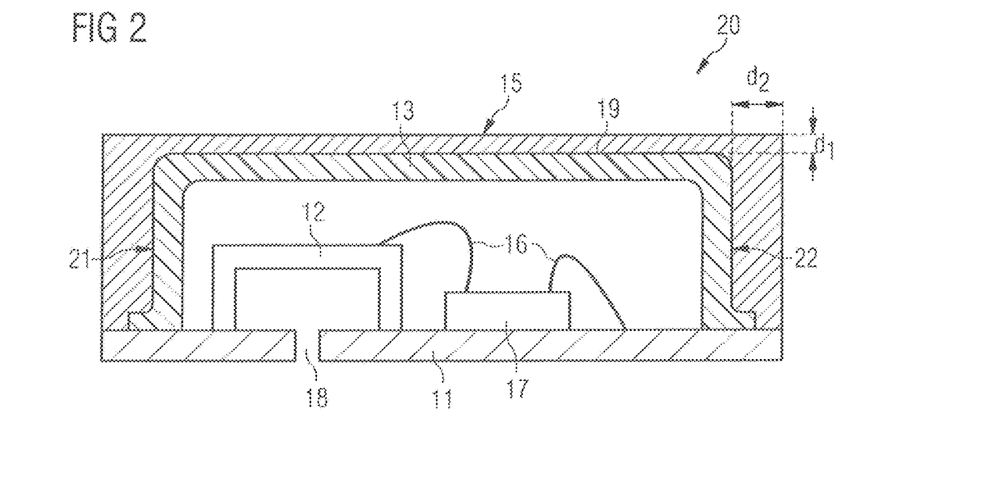
FIG. 2 shows a side view of a further exemplary embodiment of an apparatus according to the present disclosure.

FIG. 2 shows a further example of an apparatus 20 according to the present disclosure.

FIG. 2 substantially shows an apparatus 20 similar to the apparatus 10 depicted in FIG. 1, with the difference that the layer 15 completely covers all outer sides of the housing structure 13. In addition, the MEMS module 12 is illustrated as a MEMS microphone by way of example here and an optional ASIC 17, which is arranged on the first side 11A of the substrate 11, is electrically conductively coupled to the MEMS module 12 by means of bonding wires 16.

A hole 18 in the substrate 11 is arranged beneath the MEMS microphone 12. This hole 18 serves for interchanging air or acoustic vibrations with the surrounding area and is also called a sound port.

In the case of the apparatus 10 depicted in FIG. 1 and also in the case of the apparatus 20 depicted in FIG. 2, the layer 15 can be, for example, a potting compound which is cast onto the housing structure 13. However, it is also feasible that the layer 15 is a shaped part which is arranged on the housing structure 13. A shaped part of this kind can be produced, for example, in a separate shaping process and be arranged on the package 10.

For example, in the case of the apparatus 20 depicted in FIG. 2, the layer 15 can form the shape of a cover which is arranged above the housing structure 13 in order to cover said housing structure. A cover 15 of this kind can, for example, be in the form of a prefabricated shaped part.

The layer 15 can have, for example on the upper outer side 19 or the top side 19 of the housing structure 13, a layer thickness $d_1$ of between 20 μm and 200 μm which is to be dimensioned parallel to the substrate surface 11A.

The layer 15 can have, for example on lateral outer sides 21, 22 of the housing structure 13, a lateral layer thickness $d_2$ of between 20 μm and 200 μm.

The layer 15 can comprise at least one constituent part from the group comprising silicates, polyimides or epoxides. Here, the layer 15 can be composed entirely from one of these materials or comprise at least one of these materials.

The housing structure 13 itself can comprise metal or be manufactured from metal. Therefore, shielding of high-frequency radiation can be effectively ensured, even if the housing structure 13 is covered by the layer 15 in sections or completely.

Furthermore, the layer 15 can contain magnetic particles. As an alternative or in addition, the layer 15 can contain metal particles. By way of example, aluminum particles can be contained in the layer 15 in order to reduce eddy currents.

An additional magnetic housing and a means for blocking eddy currents can also be provided.

Figure 3:
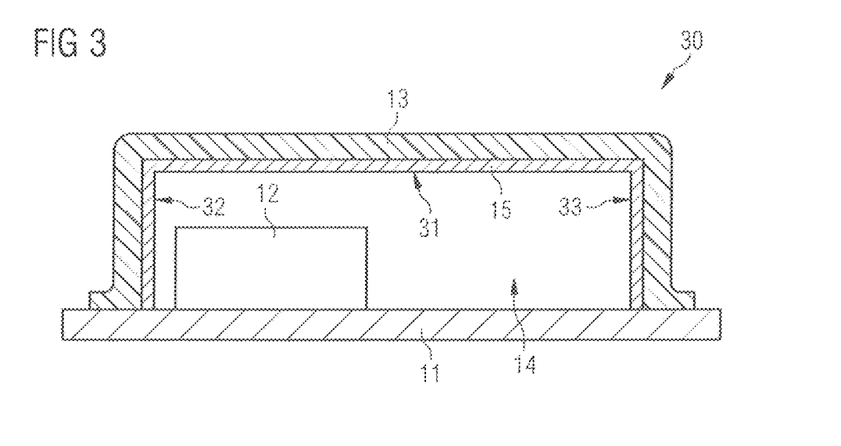
FIG. 3 shows a side view of a further exemplary embodiment of an apparatus according to the present disclosure.

FIG. 3 shows a further example of an apparatus 30 according to the present disclosure. FIG. 3 substantially shows an apparatus 30 similar to the apparatus 10 depicted in FIG. 1, with the difference that the layer 15 is not arranged on an outer side 19, 21, 22 but rather on at least one inner side 31, 32, 33 of the housing structure 13.

In this case, the layer 15 can be arranged on at least that upper inner side 31 of the housing structure 13 which is arranged opposite the first substrate side 11A. As an alternative or in addition, the layer 15 can be arranged on the lateral inner sides 32, 33 of the housing structure 13.

In the example depicted in FIG. 3, the layer 15 completely covers all inner sides 31, 32, 33 of the housing structure 13.

Figure 4:
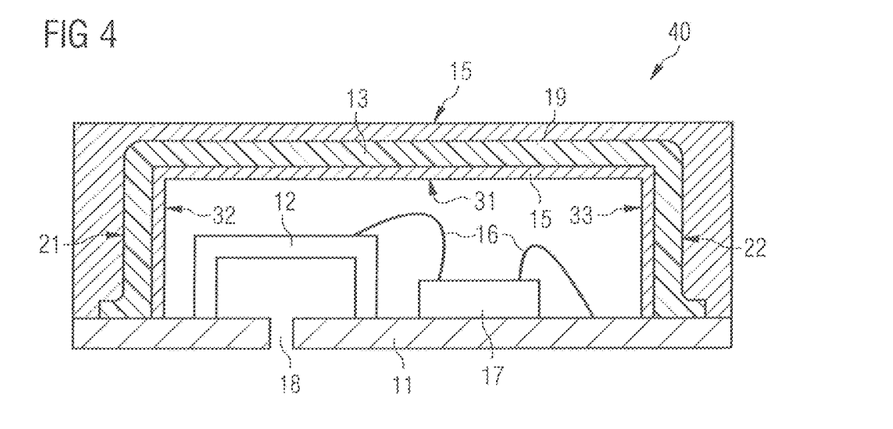
FIG. 4 shows a side view of a further exemplary embodiment of an apparatus according to the present disclosure.

FIG. 4 shows a further example of an apparatus 40 according to the present disclosure. FIG. 4 substantially shows an apparatus 40 similar to the apparatus 20 depicted in FIG. 2, with the difference that the layer 15 is arranged both on at least one outer side 19, 21, 22 and also on at least one inner side 31, 32, 33 of the housing structure 13.

FIGS. 5A to 5F schematically show an apparatus for producing an above-described apparatus 10, 20, 30, 40.

Figure 5A:
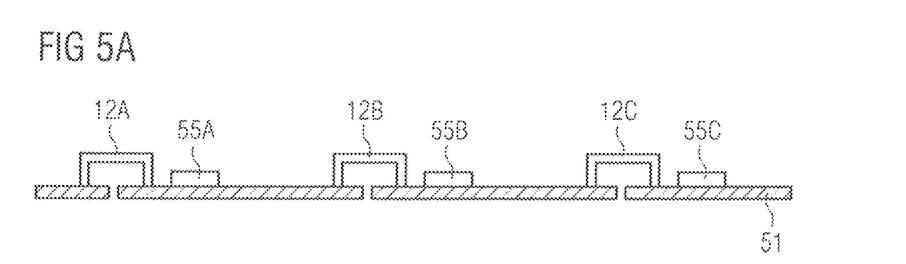
FIGS. 5A-5F show an exemplary method procedure for producing an apparatus according to the present disclosure.

A wafer substrate 51 is provided in FIG. 5A. A plurality of MEMS modules 12A, 12B, 12C are arranged on a first side of the wafer substrate 51. The MEMS modules 12A, 12B, 12C have a temperature-sensitive response. That is to say, in the case of each of these MEMS modules 12A, 12B, 12C, the respective output signal from said MEMS module changes depending on a change in temperature in the medium respectively surrounding the MEMS module 12A, 12B, 12C.

A control electronics system 55A, 55B, 55C for the operation of the MEMS module 12A, 12B, 12C can optionally be provided, as depicted. The control electronics system can be, for example, an optional ASIC 55A, 55B, 55C, wherein a respective ASIC 55A, 55B, 55C can be assigned to each MEMS module 12A, 12B, 12C.

Figure 5B:
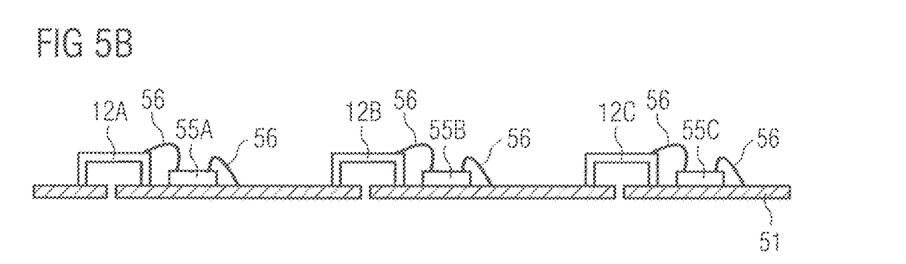

In a case of this kind, as is shown in FIG. 5B, in each case one such ASIC 55A, 55B, 55C can be electrically connected to the associated MEMS module 12A, 12B, 12C. By way of example, bonding wires 56 can be used for this purpose.

The provided wafer substrate 51 can further have a large number of housing structures 13A, 13B, 13C which are arranged on the first side of the wafer substrate 51. Each of these housing structures 13A, 13B, 13C can have a recess 14A, 14B, 14C in each of which one of the MEMS modules 12A, 12B, 12C is arranged.

Figure 5C:
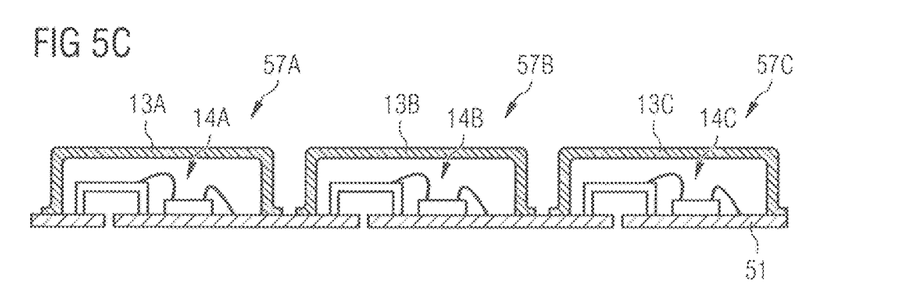

Therefore, a large number of packages 57A, 57B, 57C is provided. The packages 57A, 57B, 57C depicted by way of example here can be so-called Open Cavity Packages, OCP for short. However, said packages may also be, for example, so-called Embedded Wafer Level Ballgrid Array Packages, eWLB for short.

A package 57A, 57B, 57C according to the present invention therefore has at least a substrate, a MEMS module which is arranged on a first side of the substrate, and a housing structure which is likewise arranged on the first side of the substrate and in which the MEMS module is arranged.

Figure 5D:
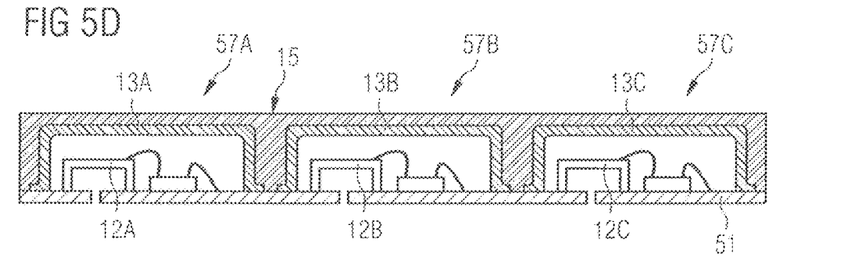

In the method according to the present disclosure, a layer 15 will now, as depicted in FIG. 5D, be applied to at least one side of each package 57A, 57B, 57C. In this case, the layer 15 is applied to at least one side of each housing structure 13A, 13B, 13C and can optionally also be arranged, as shown in FIG. 5D, at least partially on the wafer substrate 51. This layer 15 is designed in such a way that it increases the heat capacity of the individual packages 57A, 57B, 57C.

Figure 5E:
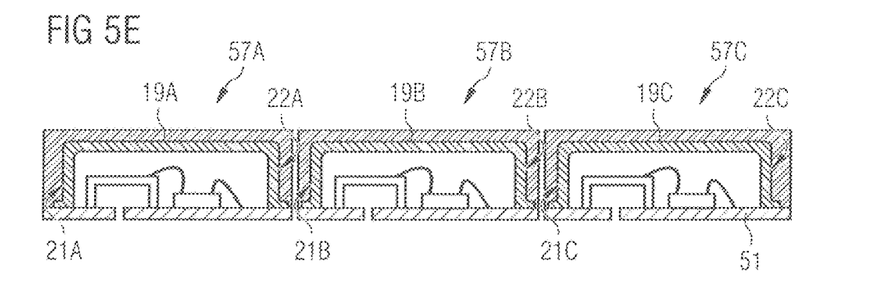

As depicted in FIG. 5E, the respective packages 57A, 57B, 57C can be separated, for example by means of sawing.

Figure 5F:
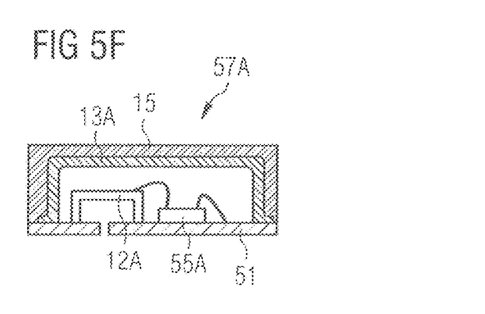

FIG. 5F shows a separated package 57A of this kind which can be obtained using the method according to the present disclosure. One advantage here is that the so-called footprint of the package 57A remains the same as in the case of a package without the layer 15.

The following modifications to and variants of the method according to the present disclosure are feasible.

For example, the step of applying the layer 15 shown in FIG. 5D comprises the layer 15 being poured in the form of a potting compound over the respective housing structures 13A, 13B, 13C of the packages 57A, 57B, 57C.

However, it would also be feasible that the step of applying the layer 15 comprises the layer 15 in the form of a shaped part being arranged on the respective housing structure 13A, 13B, 13C of the respective package 57A, 57B, 57C. Therefore, for example, a layer 15 in the form of a prefabricated cover could be arranged above a housing structure 13A, 13B, 13C.

The step of applying the layer 15 can also comprise the layer 15 being arranged on at least one outer side of the housing structure 13A, 13B, 13C of a respective package 57A, 57B, 57C. As in FIG. 5E, said outer side of the housing structure can be, for example, the top side 19A, 19B, 19C of the respective housing structure 13A, 13B, 13C, which top side is averted from the wafer substrate 51.

However, as an alternative, the step of applying the layer 15 can also comprise the layer 15 being arranged on all outer sides 19A, 21A, 22A; 19B, 21B, 22B; 19C, 21C, 22C of the housing structure 13A, 13B, 13C of the respective package 57A, 57B, 57C, so that all outer sides 19A, 21A, 22A; 19B, 21B, 22B; 19C, 21C, 22C of the respective housing structure 13A, 13B, 13C are completely covered by the layer 15, as is illustrated in FIGS. 5D, 5E and 5F.

As an alternative or in addition, the step of applying the layer 15 can comprise the layer 15 being arranged on at least one inner side of the housing structure 13A, 13B, 13C of a respective package 57A, 57B, 57C. An arrangement which can be obtained in this way has already been described with reference to FIG. 2.

As has likewise been explained with reference to FIG. 2, the step of applying the layer 15 can also comprise the layer 15 being arranged on all inner sides 31, 32, 33 of the housing structure 13A, 13B, 13C of a respective package 57A, 57B, 57C, so that the layer 15 completely covers all inner sides 31, 32, 33 of the housing structure 13A, 13B, 13C of a respective package 57A, 57B, 57C.

Therefore, in summary, the layer 15 can be arranged on one or more outer sides 19A, 21A, 22A; 19B, 21B, 22B; 19C, 21C, 22C of the housing structure 13A, 13B, 13C of a respective package 57A, 57B, 57C. The layer 15 can be arranged on one or more inner sides 31, 32, 33 of the housing structure 13A, 13B, 13C of a respective package 57A, 57B, 57C. And the layer 15 can be arranged both on one or more inner sides 31, 32, 33 and also on one or more outer sides 19A, 21A, 22A; 19B, 21B, 22B; 19C, 21C, 22C of the housing structure 13A, 13B, 13C of a respective package 57A, 57B, 57C.

FIG. 6 shows, once again in summary, a schematic block diagram of a method according to the present disclosure.

Figure 6:
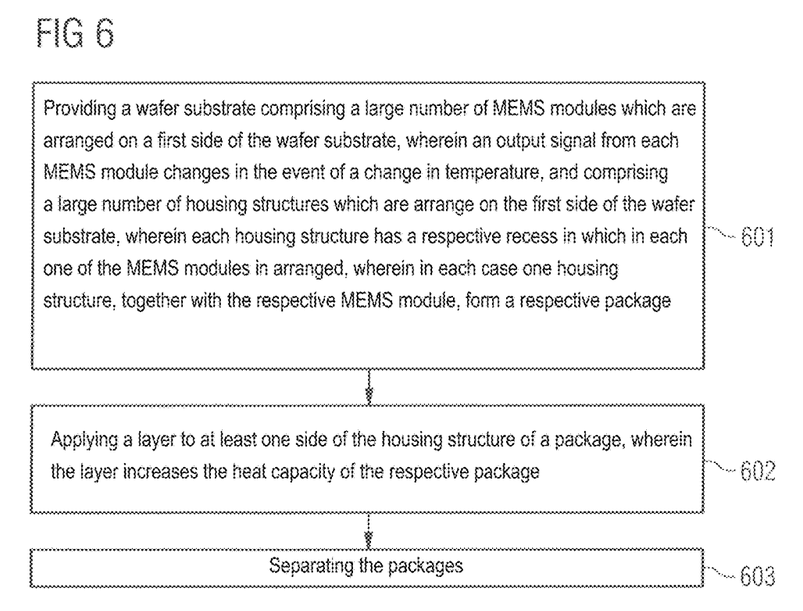
FIG. 6 shows a block diagram for illustrating individual method steps of a method according to the present disclosure.

In block 601, a wafer substrate 51 comprising a large number of MEMS modules 12A, 12B, 12C which are arranged on a first side of the wafer substrate 51 is provided, wherein an output signal from each MEMS module 12A, 12B, 12C changes in the event of a change in temperature. The provided wafer substrate 51 also has a large number of housing structures 13A, 13B, 13C which are arranged on the first side of the wafer substrate 51, wherein each housing structure 13A, 13B, 13C has a respective recess 14A, 14B, 14C in which in each case one of the MEMS modules 12A, 12B, 12C is arranged, wherein in each case one housing structure 13A, 13B, 13C, together with the respective MEMS module 12A, 12B, 12C, forms a respective package 57A, 57B, 57C.

In block 602, a layer 15 is applied to at least one side 19A, 19B, 19C of the housing structure 13A, 13B, 13C of a package 57A, 57B, 57C, wherein the layer 15 increases the heat capacity of the respective package 57A, 57B, 57C.

In block 603, the respective packages 57A, 57B, 57C are separated.

The method steps illustrated in FIGS. 5A to 5F and in FIG. 6 can also be carried out in a different order to that depicted.

The present disclosure also relates not only to individual packages 57A, 57B, 57C but also to a wafer, described with reference to FIGS. 5A to 5F, comprising a wafer substrate 51 and a large number of apparatuses or packages 57A, 57B, 57C. The individual apparatuses or packages 57A, 57B, 57C, which can be produced using the method described with reference to FIGS. 5A to 5F, can be identical to the packages 57A, 57B, 57C as have been described with reference to FIGS. 1 to 4.

Feasible exemplary embodiments and also advantages and properties of the present disclosure will be summarized once again in other words in the text which follows. These will be described, by way of example, using MEMS modules which are in the form of MEMS microphones, wherein the present disclosure is not limited to MEMS microphones.

Therefore, by way of example in the case of MEMS microphones 12A, 12B, 12C of this kind, protection against the environment is guaranteed by means of the packages 57A, 57B, 57C, this also including, amongst other things, protection against high frequency interference which is caused by external high-frequency radiation and other influences which have a negative effect on the performance of the MEMS module.

Since the performance of MEMS microphones, in particular the signal-to-noise ratio (SNR), has greatly increased in recent years, focus is increasingly being placed on the shielding capabilities of the packages 57A, 57B, 57C in current developments. In order to achieve maximum SNR values nowadays, a completely new effect which has not been known to date and impairs and limits the SNR performance of MEMS microphones 12A, 12B, 12C has to be taken into consideration. This effect is called high-frequency thermal coupling.

Standard high-frequency interference shields use an absorption principle, wherein the cover and the substrate are electrically grounded. As a result, a direct high-frequency influence on the sensitive MEMS component 12A, 12B, 12C and an optional ASIC is not possible. However, in the case of the occurrence of high-frequency thermal coupling, the high-frequency energy which is absorbed by the shield (cover, substrate) is converted into thermal energy. As a result, the temperature in the interior of the package 57A, 57B, 57C abruptly rises by several microkelvins. The resulting expansion of air impairs the membrane and thereby ultimately limits the SNR performance of the MEMS microphone.

As has already been described at the start with reference to FIG. 8, this is not simply theoretical. The abovementioned effect of the high-frequency thermal coupling can be demonstrated by suitable measurements and therefore forms a considerable challenge to manufacturers of temperature-sensitive MEMS modules, including MEMS microphones for example.

An apparatus or a package 57A, 57B, 57C according to the present disclosure, as is shown in FIG. 1 for example, is based on a laminate substrate 11 and a housing structure 13. This housing structure 13 can be, for example, a metal cover. The housing structure 13 forms a cavity 14 and a rear-side volume or a back volume. Different variants of packages of this kind are feasible, wherein the cavity 14 is sometimes formed by means of a prefabricated substrate or by means of special lamination techniques.

The cavity 14 firstly forms a space for the MEMS module 12 and an optional ASIC 17 (FIG. 2) and, however, at the same time also serves as a system-related back volume. The back volume is an important factor for the SNR values to be achieved. The electrical connections used can be, for example, bonding wire connections (wire bonding). In the case of MEMS microphones, the so-called sound port 18 (FIG. 2) is likewise an important constituent part of the package. In the simplest case, said sound port can be a hole in the housing structure 13. However, in most cases, said sound port is a hole in the substrate 11, as depicted in FIG. 2. The sound port 18 is important in order to achieve high SNR values.

In this package, the high-frequency shielding can be provided, for example, by means of a ground layer in the substrate 11 and also a grounded metal housing 13 which is electrically connected to the ground layer by means of an annular ground ring.

As has already been mentioned, a great deal of focus has not yet been placed on the high-frequency thermal coupling. However, if the signal-to-noise ratio (SNR) is more than 70 dB, the high-frequency thermal coupling will then limit the theoretically possible SNR performance. This is critical particularly in mobile applications since this effect leads to reduced SNR values during a call or even when a mobile telephone is connected to a base station. Microphone packages which have been known to date do not provide satisfactory shielding against a high-frequency thermal coupling.

The present disclosure uses a researched and laboratory-tested method in order to increase the shielding properties of the apparatuses or packages 57A, 57B, 57C against high-frequency thermal coupling. According to the present disclosure, the thermal mass of the housing structure 13 and of the entire package 57A, 57B, 57C is increased. The thermal mass is also called the thermal capacity or the heat capacity. An additional magnetic housing and means for suppressing eddy currents would likewise be feasible and useful.

The idea of the present disclosure can be summarized as that of a package which is potted using functional potting compound. The functional potting compound can contain a thermally active material. A thermally active material can increase the heat capacity of the respective apparatus or package 57A, 57B, 57C.

Other options, such as providing thermally active material in the interior of the cavity 14 for example, would likewise be feasible. However, in the case of MEMS microphones, this can impair the performance of a microphone, for example on account of a reduced back volume.

Applying the thermally active material can take place in the form of applying a layer 15 of this material to at least one side of the housing structure 13. A conventional potting method can be used for this purpose for example. One of the main ideas of the present disclosure is that of increasing the thermal mass or heat capacity of the entire housing structure 13 by means of the layer 15 (for example potting compound).

In addition, it may be useful to use special compositions for the layer 15. For example, the layer 15 can comprise magnetic filler particles or aluminum particles to counter eddy currents. However, the focus is on particles with a high thermal mass.

A further characteristic of the concept disclosed in this document provides that all known and important functions of the package 57A, 57B, 57C continue to be retained. That is to say, the electrical high-frequency shielding is further ensured by, for example, a metal housing structure 13. The shielding part, the substrate 11 and the back volume can also remain unchanged.

FIGS. 5A to 5F show an exemplary procedure of a method according to the present disclosure. A plurality of different methods are available for OCP packages, said methods potentially being useful in order to produce apparatuses or packages 57A, 57B, 57C of this kind. Therefore, the final method procedure can differ somewhat from the order of the method procedure illustrated in FIGS. 5A to 5F, without changing the main characteristic of the claimed package variant.

Although some aspects have been described in connection with an apparatus, it goes without saying that these aspects also constitute a description of the corresponding method, so that a block or a structural element of an apparatus is also to be understood as a corresponding method step or as a feature of a method step. Analogously, aspects which have been described in connection with a method step or as a method step also constitute a description of a corresponding block or detail or feature of a corresponding apparatus.

What is claimed is:

1. An apparatus comprising:
    a substrate, wherein a MEMS module is arranged on a first side of the substrate, the MEMS module configured to produce an output signal that changes in the event of a change in temperature,
    a housing structure arranged on the first side of the substrate, the housing structure comprising a recess in which the MEMS module is arranged, and
    a layer applied to the housing structure, the layer configured to increase a heat capacity of the apparatus, wherein a heat capacity of the layer is greater than a heat capacity of the housing structure by at least a factor of one and a half.

2. The apparatus as claimed in claim 1, wherein the layer has a thermal conductivity of less than $$0.2 \cdot 10^{-6} \frac{m^2}{s}.$$

3. The apparatus as claimed in claim 1, wherein the layer comprises a potting compound cast on the housing structure, or wherein the layer comprises a shaped part arranged on the housing structure.

4. The apparatus as claimed in claim 1, wherein the layer comprises at least one constituent part from the group consisting of silicates, polyimides or epoxides.

5. The apparatus as claimed in claim 1, wherein the layer is arranged on at least one outer side of the housing structure.

6. The apparatus as claimed in claim 1, wherein the layer completely covers all outer sides of the housing structure.

7. The apparatus as claimed in claim 1, wherein the layer is arranged on at least one inner side of the housing structure.

8. The apparatus as claimed in claim 1, wherein the layer completely covers all inner sides of the housing structure.

9. The apparatus as claimed in claim 1, wherein the layer contains magnetic particles.

10. The apparatus as claimed in claim 1, wherein the layer contains metal particles.

11. The apparatus as claimed in claim 1, wherein the MEMS module is a MEMS microphone.

12. A wafer comprising a plurality of apparatuses as claimed in claim 1.

13. A method comprising the following steps:
    providing a wafer substrate comprising a plurality of MEMS modules arranged on a first side of the wafer substrate, wherein an output signal from each MEMS module of the plurality of MEMS modules changes in the event of a change in temperature, and comprising a plurality of housing structures arranged on the first side of the wafer substrate, wherein each housing structure of the plurality of housing structures has a recess in each of which one of the plurality of MEMS modules is arranged, and wherein the plurality of housing structures and the plurality of MEMS modules form a plurality of packages, each housing structure of the plurality of housing structures together with its respective MEMS module of the plurality of MEMS modules forming one package of the plurality of packages
    applying a layer to at least one side of the housing structure of the plurality of packages, wherein the layer increases a heat capacity of each package of the plurality of packages, a heat capacity of the layer is greater than a heat capacity of the plurality of housing structures by at least a factor of one and a half, and
    separating each of the plurality of packages.

14. The method as claimed in claim 13, wherein the step of applying the layer comprises casting a potting compound over the housing structure of each package of the plurality of packages.

15. The method as claimed in claim 13, wherein the step of applying the layer comprises arranging a shaped part on the housing structure of each package of the plurality of packages.

16. The method as claimed in claim 13, wherein the step of applying the layer comprises arranging the layer on at least one outer side of the housing structure of each package of the plurality of packages.

17. The method as claimed in claim 13, wherein applying the layer comprises arranging the layer on all outer sides of the housing structure of each package of the plurality of packages, wherein all outer sides of the housing structure of each package are completely covered by the layer.

18. The method as claimed in claim 13, wherein applying the layer comprises arranging the layer on at least one inner side of the housing structure of each package of the plurality of packages.

19. The method as claimed in claim 13, wherein applying the layer comprises arranging the layer on all inner sides of the housing structure of each package of the plurality of packages, wherein the layer completely covers all inner sides of the housing structure of each package.

20. The method as is claimed in claim 13, wherein the layer contains magnetic particles.

21. An apparatus comprising:
  a substrate, wherein a MEMS module is arranged on a first side of the substrate, the MEMS module configured to produce an output signal that changes in the event of a change in temperature,
  a housing structure arranged on the first side of the substrate, the housing structure comprising a recess in which the MEMS module is arranged, and
  a layer applied to the housing structure, the layer configured to increase a heat capacity of the apparatus, wherein the layer contains magnetic particles.

* * * * *